United States Patent [19]

Friend et al.

[11] Patent Number: 5,698,048
[45] Date of Patent: Dec. 16, 1997

[54] PHOTORESPONSIVE MATERIALS

[75] Inventors: Richard Friend; Annette Köhler, both of Cambridge, United Kingdom

[73] Assignee: Cambridge Display Technology Limited, Cambridge, United Kingdom

[21] Appl. No.: 569,710

[22] Filed: Dec. 8, 1995

[30] Foreign Application Priority Data

Dec. 9, 1994 [GB] United Kingdom ............... 9424894

[51] Int. Cl.$^6$ ................................................. H01L 31/00
[52] U.S. Cl. .................. 136/263; 136/252; 136/255; 257/40; 257/431; 257/449; 428/457; 428/461; 428/913
[58] Field of Search .................. 136/252, 255, 136/263; 257/40, 431, 449; 428/411.1, 457, 461, 913

[56] References Cited

U.S. PATENT DOCUMENTS 5,171,373 12/1992 Hebard et al. ............... 136/252

FOREIGN PATENT DOCUMENTS

WO 94/05045 3/1994 WIPO.

OTHER PUBLICATIONS

A. Kohler, H.F. Wittmann, R.H. Friend, M.S. Khan, J. Lewis, "The photovoltaic effect in a platinum poly-yne." Synthetic Metals, vol. 67, No. 1/3, Nov. 1994, Lausanne, CH, , pp. 245-249.

G. Yu, K. Pakbaz, and A.J. Heeger, "Semiconducting polymer diodes: Large size, low cost photodetectors with excellent visible–ultraviolet sensitivity." Applied Physics Letters, vol. 64, No. 25, 20 Jun. 1994, New York US, pp. 3422-3424.

N.S. Sariciftci, L. Smilowitz, A.J. Heeger and F. Wudl, "Semiconducting polymers (as donors) and buckminsterfullerene (as acceptor): photoinduced electron transfer and heterojunction devices." Synthetic Metals, vol. 59, No. 3 Aug. 1993, Lausanne, CH, pp. 333-352.

H.F. Wittmann, K. Fuhrmann, R.H. Friend and M.S. Khan and J. Lewis, "Optical Excitations in Transition Metal Containing Poly-ynes." Synthetic Metals, vol. 55, No. 1, 15 Mar. 1993, Lausanne, CH pp. 56-61.

H.R. Wittmann, and R. H. Friend ,and M.S. Khan and J. Lewis, "Optical spectroscopy of platinum and palladium containing poly-ynes." Journal Of Chemical Physics, vol. 101, No. 4, 15 Aug. 1994, New York USA, pp. 2693-2698.

*Primary Examiner*—D. S. Nakarani
*Attorney, Agent, or Firm*—Merchant, Gould, Smith, Edell, Welter & Schmidt, P.A.

[57] ABSTRACT

A photoresponsive material comprises molecular or polymeric semiconductors in which photogeneration of separated charge carriers proceeds substantially via an intermediate stage of a triplet exciton, where the generation of the triplet exciton may be facilitated by the presence of elements of high atomic number, and in which the generation of separated charges from the intermediate triplet excited states is facilitated by the presence of at least two semiconductive components, one of which is of high electron affinity and able to accept electrons, and the other of which is of low ionisation potential and therefore able to accept positive charge carriers, the difference between the electron affinity of the former and the ionisation potential of the latter being sufficiently low so as to allow the ionisation of a triplet exciton which is present on either of the two aforementioned semiconductive components or on a third component. The provision of contact electrodes allows charge to be collected by an external electrical circuit and allows light to be incident on the active photoresponsive material.

14 Claims, 5 Drawing Sheets

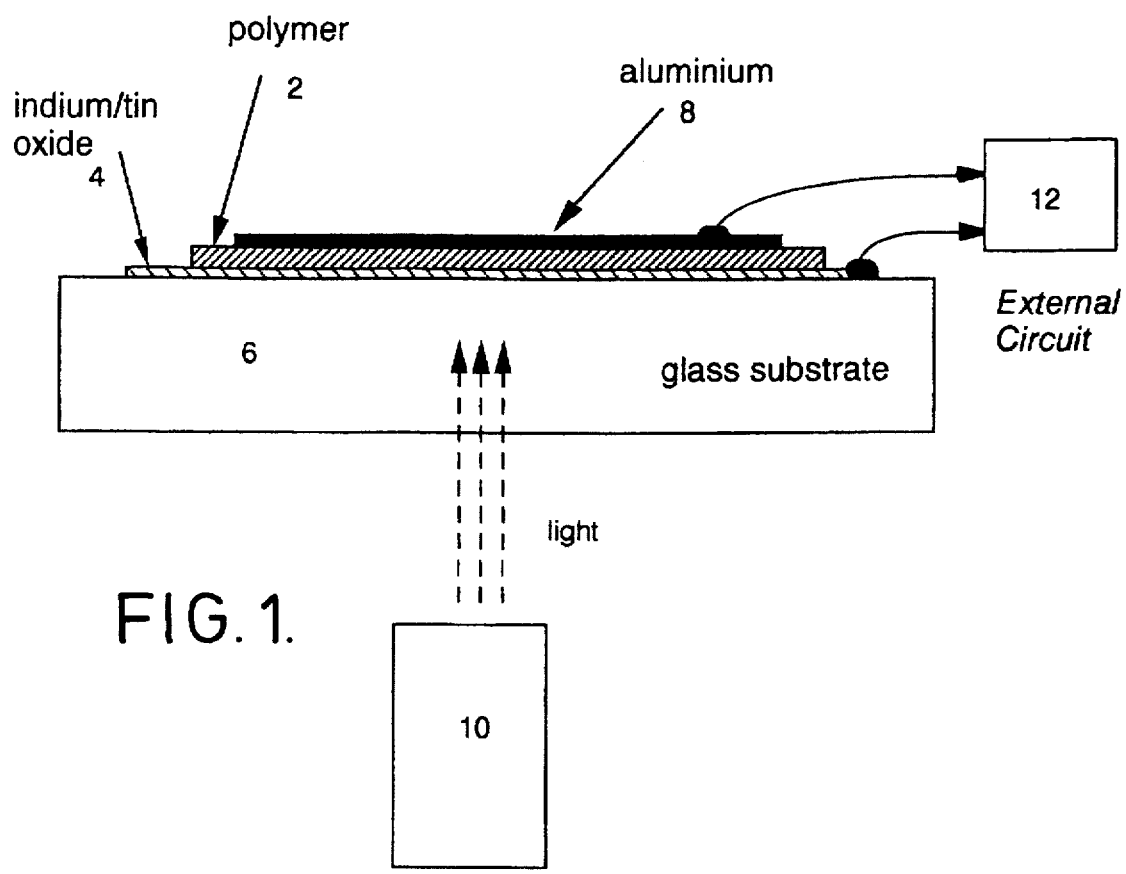
FIG. 1.
Pt-poly-yne  FIG. 2.
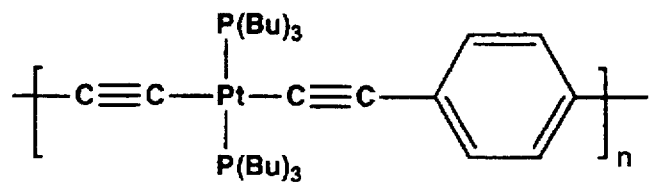
Bu = C$_4$H$_9$

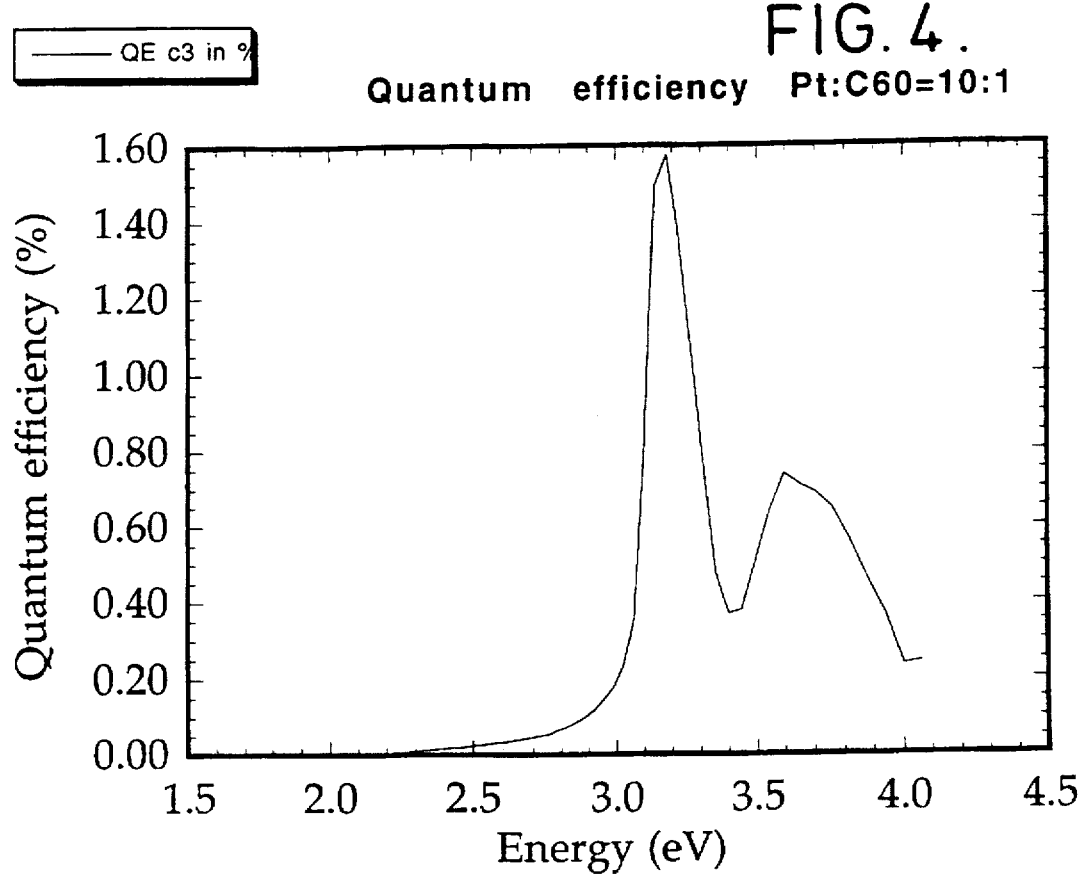
FIG. 4. Quantum efficiency Pt:C60=10:1
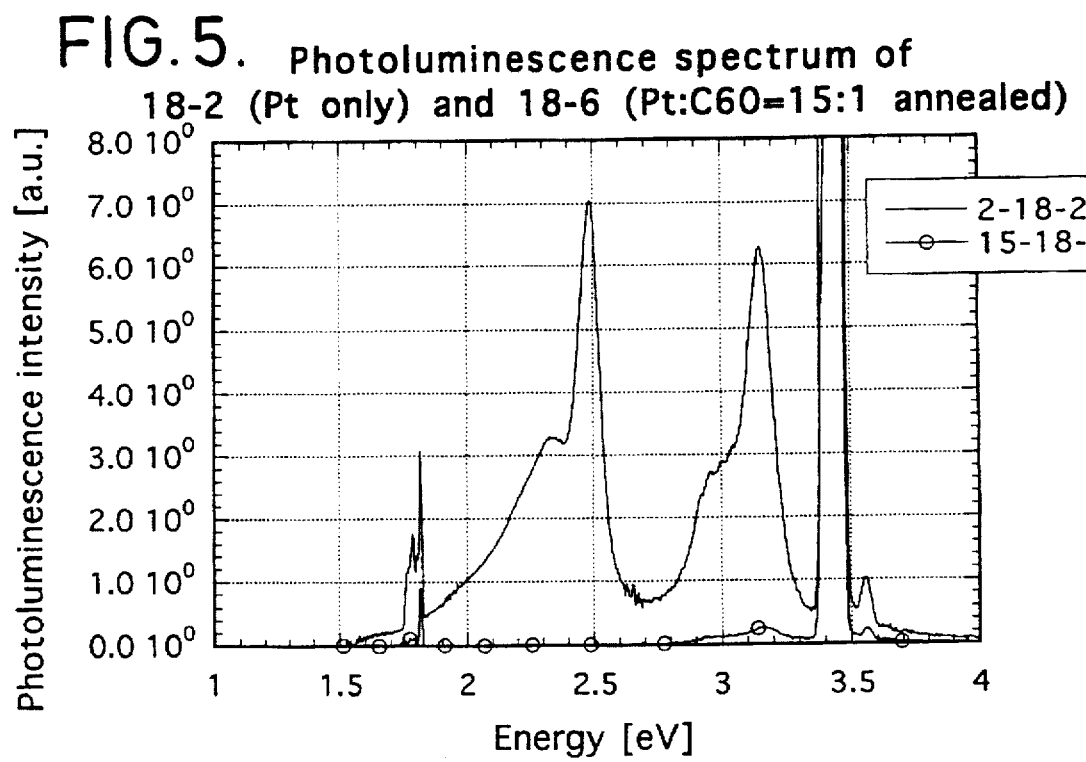
FIG. 5. Photoluminescence spectrum of 18-2 (Pt only) and 18-6 (Pt:C60=15:1 annealed)

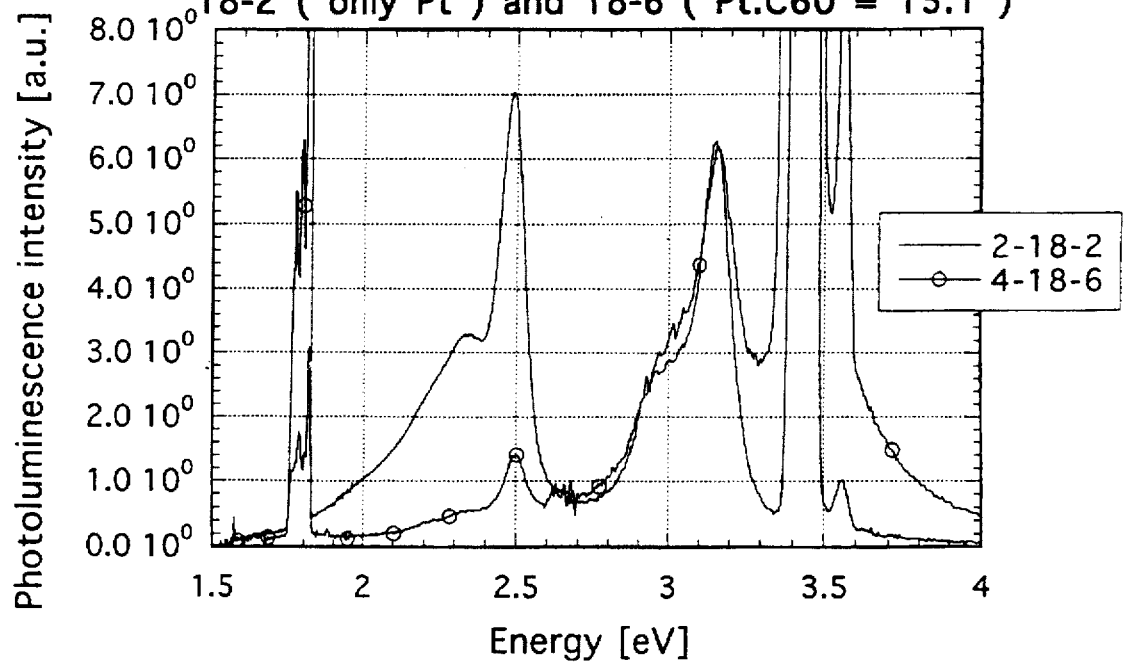
FIG. 6. Photoluminescence spectra of 18-2 (only Pt) and 18-6 (Pt:C60 = 15:1)
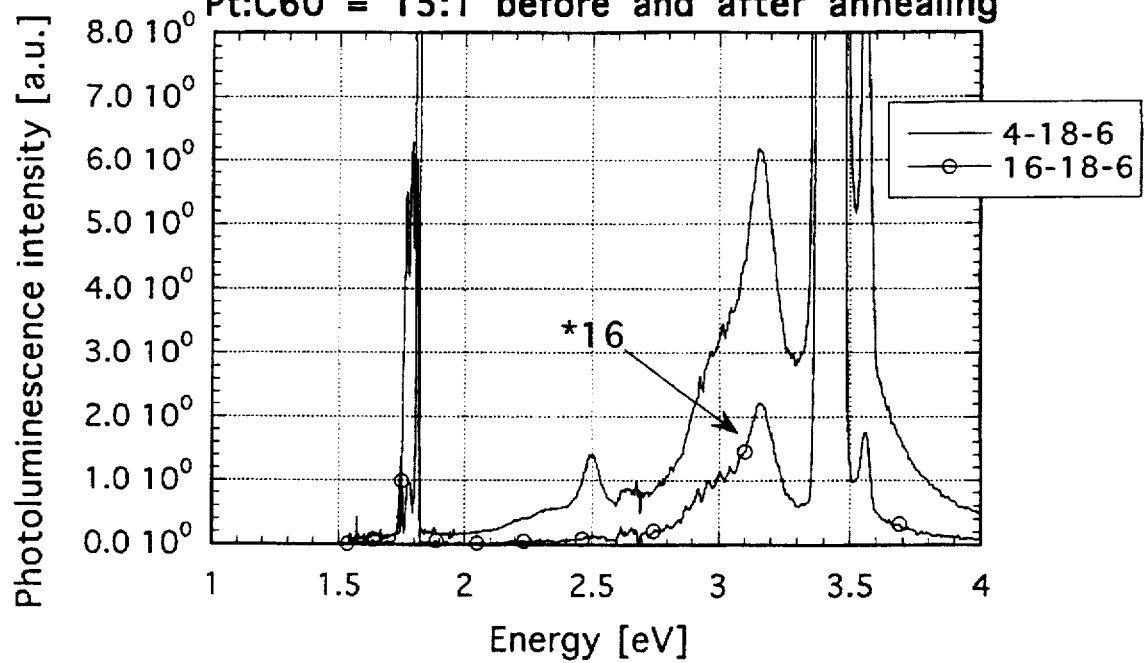
FIG. 7. Photoluminescence spectra of Pt:C60 = 15:1 before and after annealing Photoluminescence spectra of 18-6 ( Pt:C60 = 15:1 ) and 30-1 ( Pt:C60 = 1:1 )

Absorption of Pt-Poly-yne and Pt:C60=10:1

PHOTORESPONSIVE MATERIALS

FIELD OF THE INVENTION

This invention relates to photoresponsive materials and to their use in photoconductive and photovoltaic devices.

BACKGROUND OF THE INVENTION

The photogeneration of separated electronic charges in semiconductive materials has long been studied as a means for the interconversion of light (particularly solar) energy into electrical energy (the photovoltaic effect) and, with the application of an external electrical bias, the generation of an electrical current to allow detection of incident light (the photoconductive response). One of the many difficulties in obtaining efficient generation of charge following photoexcitation is that the separated negative charges (electrons) and positive charges (holes) may recombine to form a neutral excited state before they can be collected by the external electrodes. Another difficulty is that in order to absorb all the light incident on the semiconductive material, its thickness may be too great to allow easy transport of the electrons and holes to their respective electrodes, and the thickness may be so great as to allow considerably opportunity for capture of electrons and holes travelling past one another in the bulk of the material.

These difficulties are particularly serious in semiconductive materials which comprise molecular or polymeric semiconductors in which the mobile charge carriers are contained in orbitals which involve carbon pi orbitals. This is in part because the binding energies of the electron and hole can be considerably higher than the thermal energy at room temperature, such that dissociation of charge carriers is difficult and recombination easy. A further problem is that the mobility of one or other charge carrier can be very low, such that movement of such charge carriers across the full thickness of the semiconductive layer is difficult to achieve.

One such semiconductive conjugated polymer is poly (para-1,4 phenylene vinylene), PPV. This polymer can be formed as thin films by a number of methods including solution processing of soluble precursors, or, with suitable attachment of side-groups such as alkoxy groups attached at the 2 and 5 positions at the phenylenes, can be directly processed from solution. The photoconductive and photovoltaic properties of this polymer have been reported at the International Symposium on Electroluminescence in Polymers, Eindhoven, The Netherlands, 15th Sep. 1993, and in "The Photovoltaic Response in Poly(p-phenylene vinylene) Thin Film Devices", R. N. Marks, J. J. M. Halls, D. D. C. Bradley, R. H. Friend and A. B. Holmes; J. Phys. Condensed Matter 6, 1379–1394 (1994). It is considered there that photogeneration of charge carriers results from ionisation in the bulk of the polymer of the singlet excitons formed by photoexcitation, but this process is not intrinsically efficient when measurements are made in the photovoltaic mode (bias voltages between the open circuit voltage of the device and zero volts), with values of no more than a percent for the quantum efficiency of photon to charge conversion for devices using optimised electrodes (calcium for electron collection in this mode), and considerably lower when using more stable electrodes in this role which are less well matched in terms of their electronic properties, such as aluminium.

Properties have also been reported for the dialkoxy derivatives of PPV, for instance in "Dual-Function Semiconducting Polymer Devices: Light-Emitting and Photodetecting Diodes", G. Yu, C. Zhang and A. J. Heeger, Appl. Phys. Lett. 64, 1540–1542 (1994), and "Semiconducting Polymer Diodes: Large size, Low Cost Photodectors with Excellent Visible-Ultraviolet Sensitivity", G. Yu, K. Pakbaz and A. J. Heeger, Appl. Phys. Lett 64, 20 Jun. 1994 (1994).

SUMMARY OF THE INVENTION

The aim of the present invention is to increase the efficiency of charge generation following photon absorption. According to an aspect of the present invention this is achieved by increasing the lifetime of an intermediate neutral excited state, by causing it to cross from the singlet spin manifold in which it might have been formed to the spin triplet manifold, and then causing the triplet exciton to be ionised to enhance charge separation. Since radiative transitions of the triplet exciton to the ground electronic state, which is in the spin singlet manifold, are very slow, the triplet excited state can survive for very much longer than the singlet excited state before radiative decay. This can allow it more time to undergo ionisation, and thus substantially raise the efficiency of the charge separation process. In one embodiment of the present invention a photoresponsive material is provided which contains a polymer or molecule which contains an element of high atomic number which is closely coupled to the molecular wavefunctions which are used to provide the semiconductive properties. The presence of such a high atomic number element can cause mixing of the singlet and triplet manifolds, by action of the spin-orbit coupling interaction, and this can then allow efficient crossover from the singlet excited states generated by photoexcitation to the intermediate triplet excited state.

One possible difficulty in the use of triplet excitons is that they are commonly found to show higher binding energies against excitation to form separated electrons and holes than singlet excitons, and thus may prove difficult to use as intermediates in the photogeneration of charge carriers. To overcome this, the photoresponsive material includes two substances, one of high electron affinity, and the other of low ionisation potential to provide respectively electron and hole accepting functions. It will be clear that the polymer or molecule which contains the element of high atomic number may also provide one or other of these two functions. Accordingly, a further embodiment of the invention provides a photoresponsive device containing at least two semiconductive components which may be in the form of separated but adjacent layers, or else in the form of a blended composite material, with the two semiconductive components selected so that one is of high electron affinity and therefore able to accept electrons, and the other is of low ionisation potential and therefore able to accept positive charge carriers, the difference between the electron affinity of the former and the ionisation potential of the latter being sufficiently low as to allow the ionisation of a triplet exciton which is present on either of the two aforementioned components or on a third component.

A further aspect of the invention is the manufacture of photoresponsive device having the aforementioned features in semiconductive materials which can be conveniently formed as thin films over large areas by the use of solution-processing of soluble materials which are film-forming. Among these, polymers are selected which contain substantial fractions of conjugated units (i.e. units in which there are pi molecular orbitals formed on carbon atoms which are delocalised over the full extent of the molecular unit), such polymers being capable of providing both the film-forming properties of the composite and also at least some of the semiconductive, charge-transporting properties.

The photogeneration of separated charges in the bulk of such materials is generally considered to be an inherently difficult process on account of the high binding energy of the electon and hole. Easier charge separation can be achieved if two semiconductive materials are in close proximity and arranged so that one is better able to receive an electron and the other the hole, with the difference in electron affinity for the former and ionisation potential for the latter arranged to be less than the energy of the bound exciton. Elegant demonstrations of the efficient collection of charges produced from photons absorbed close to the interface between two such semiconductive layers have been made using molecular semiconductors, as reported in "Two-Layer Organic Photovoltaic Cell", C. W. Tang, Appl. Phys. Lett 48, 183–185 (1986). This device is limited in efficiency by the requirement to make the semiconductive layers sufficiently thick to absorb the incident photons, but as the same time thin enough to allow excitons generated throughout the thickness of these layers to diffuse to the interface at which ionisation can proceed. With the short lifetimes found for singlet excitons, of no more than a few nanoseconds in materials of this, the diffusion range is typically no more than a few tens of nanometers, and typically a factor of 10 less than the thickness required for full absorption.

These problems can be overcome by providing a material in which crossover to the triplet manifold is encouraged and in which the resulting triplet exciton is then ionised to render charge separation more efficient.

In work done recently, for example as described in "Optical Spectroscopy of Platinum and Palladium Containing Poly-ynes", H. F. Wittmann, R. H. Friend, M. S. Khan and J. Lewis, J. Chem Phys. 101, 2693 (1994), it is shown that polymers containing transition metals such as platinum and palladium within the main polymer chain can show semiconductive properties and can show very efficient intersystem conversion from singlet excited states to triplet excited states. These polymers are formed by the complexation of the metals in a square-planar configuration, with acetylenic groups forming ligands to opposite vertices of the square, and tributyl phosphonium groups forming the other two ligands. Connection of acetylenic groups to different metal sites via conjugated spacers such as para-phenylene provides the polymer structure. Detection of the formation of triplet excitons is made in various ways, including the measurement of phosphorescence (i.e. triplet to singlet ground state luminescence) which can be extremely efficient in these materials. This phosphorescence is efficient because the matrix element connecting excited and ground states is considerably enhanced on account of the presence of the heavy metal atoms which provide strong spin-orbit coupling so that the radiative lifetimes for polymers formed with the metal chosen as platinum and palladium are 30 and 500 microseconds respectively.

Evidence that these polymers can show semiconductive properties is presented in "The photovoltaic effect in a Platinum Poly-yne", A. Köhier, H. F. Wittmann, R. H. Friend, M. S. Khan and J. Lewis, presented at the meeting of the European Materials Research Society, Strasbourg, France, 23–26 May 1994, and to be published in Synthetic Metals. However, only a very weak photoconductive response can be obtained when this polymer is sandwiched between electrodes of indium/tin oxide and aluminium, with quantum efficiency typically no more than 0.01%.

These metal-containing poly-ynes form one of many such molecular or polymeric materials in which heavier elements are coupled into the excited states of semiconductive materials. Besides the very extensive range of transition metals which can be coupled to form square-planar or octahedrally-coordinated complexes of this type, other materials which incorporate bromine or iodine groups, metal-containing porphyrins and phthalocyanines, and metallocenes coupled to form delocalised pi electron systems are also suitable as materials which permit efficient crossover from the singlet to the triplet excited state.

The present inventors discovered that the photoresponsive efficiency of materials of this type can be remarkably increased by the inclusion of a substance having a high electron affinity, which causes the triplet excitons to be ionised and thus increase the efficiency of the charge separation process. A particularly suitable material having a high electron affinity is fullerene, $C_{60}$. Other materials, selected to have high electron affinities, and which might therefore also be used in this role are conjugated polymers with electron withdrawing groups either in the main chain or attached as side-groups. Examples of the former are poly(pyridine) and poly(pyrazine), and poly(pyridine vinylene) and poly(pyrazine vinylene). Examples of the latter include derivatives of poly(p-phenylene vinylene) with nitrile groups attached to the main chain, at, for example, the vinylic carbons, as described in "Efficient Polymer-Based Light-Emitting Diodes. Based on Polymers with High Electron Affinities", N. C. Greenham, S. C. Moratti, D. D. C. Bradley, R. H. Friend and A. B. Holmes, Nature 365, 628–630 (1993). Other examples are molecules or polymers containing electron withdrawing groups such as oxazole and oxadiazole.

Embodiments of the invention will now be described, by way of example, with reference to the accompanying drawings.

BRIEF DESCRIPTION OF THE DRAWINGS

FIG. 1 is a digram of a photoresponsive device.

FIG. 2 shows the molecular structure of a platinum poly-yne, refered to as the Pt-poly-yne.

FIG. 4 shows the same spectrum for a Pt-Poly-yne/$C_{60}$ Blend (Pt:$C_{60}$=10:1), also sandwiched between indium/tin oxide and aluminium electrodes.

FIG. 5 compares the photoluminescence spectra of the device with only Pt-poly-yne and the device with a Pt-Poly-yne/$C_{60}$ blend (PtC:$_{60}$=15:1). The sample containing $C_{60}$ was annealled at 160° C. for 10 hours.

FIG. 6 displays the same information for a device as described in FIG. 4 but before the annealing of the blend device (PtC:$_{60}$=15:1).

FIG. 7 shows the effect of annealing the Pt-poly-yne/$C_{60}$ blend(PtC:$_{60}$=15:1) device on the photoluminescence. The data for the annealled device are scaled up by a factor of 16.

DESCRIPTION OF THE PREFERRED EMBODIMENT

Figure 3:
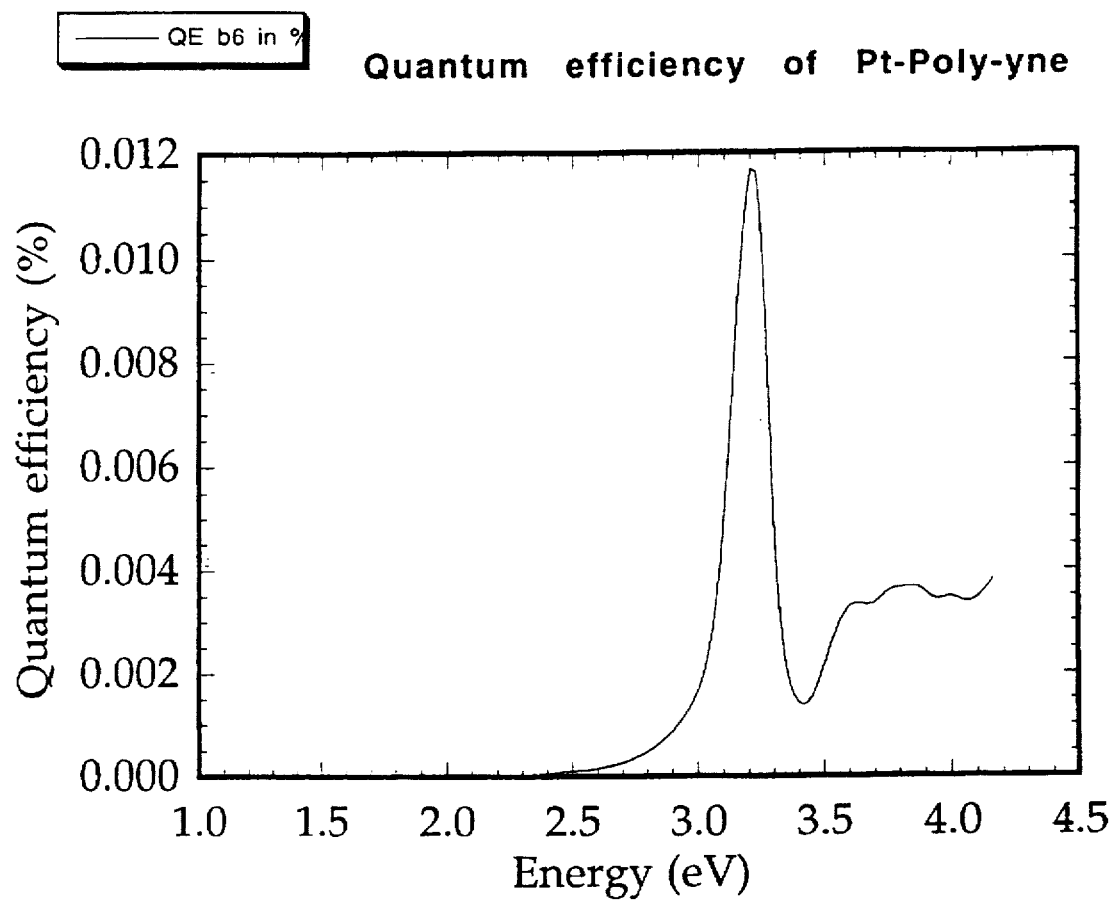
FIG. 3 shows the spectral response of the photocurrent of platinum polymer measured under short-circuit conditions in a device with ITO and aluminium electrodes. The light was incident from the ITO side. The actual quantum efficiency (=number of archieved charge carriers/number of incident photons) is plotted on the vertical axis.

FIG. 1 shows a photoresponsive device according to one embidiment of the invention. To fabricate a photoresponsive device of the type shown in FIG. 1, polymer layer 2 is spin-coated onto an electrode 4 of metal, here indium/tin oxide which is already deposited on a glass substrate 6. After deposition of the polymer layer 2, a further top electrode 8 of aluminium is vacuum evaporated to form the working device. The polymer layer 2 includes a photoresponsive material which contains an element of high atomic number which is closely coupled to the molecular wavefunctions which are used to provide the semiconductive properties. The presence of such a high atomic number element can cause mixing of the singlet and triplet manifolds, by action of the spin-orbit coupling interaction, and this can then allow efficient crossover from the singlet excited states generated by photoexcitation to the intermediate triplet excited state.

FIG. 2 shows the structure of a polymer, Pt-poly-yne, forming the polymer layer and containing the heavy element, here platinum, and which also functions as a hole-collecting semiconductive component for these examples. This polymer is selected from the transition metal poly-ynes so that it can be processed in solution in toluene, and is spin-coated from solution to form films of thicknesses of the order 100 nm. Thin films of the polymer were also spin-coated directly onto glass substrates to provide samples suitable for measurements of photoluminescence.

To cause ionisation of the triplet excitons, a further substance of high electron affinity is provided. In the present example this substance is fullerene, $C_{60}$. This Pt-poly-yne is cosoluble with the fullerene $C_{60}$, and mixtures of the two were obtained by spin-coating the codissolved materials from solution in toluene. The fullerene used for this purpose was a mixture of $C_{60}/C_{70}$ of nominal composition 98% $C_{60}$. Similar mixtures with other components could also be obtained in this way, and alternative electron-accepting materials could be chosen in place of $C_{60}$. These would include nitrile derivatives of PPV selected to show high electron affinities.

In the operation of the device described above, light is incident through the indium/tin oxide electrode 4 onto the semiconductive polymer layer 2. Spectrally-resolved light is produced by selecting a pass band of wavelengths from a tungsten lamp 10 using a grating monochromator (Bentham ¼ Meter). Electrical measurements were made using standard laboratory voltage, sources and picoammeters (such as manufactured by Keithley Instruments). For the measurements we mention below, the device was operated under short-circuit conditions with the two electrodes held at the same potential and with measurement of the current flowing between these two electrodes. In FIG. 1, block 12 generally denotes the electrical equipment.

FIG. 3 shows the photovoltaic quantum efficiency under short circuit conditions for a device made with Pt-poly-yne. We note that a response is seen above the threshold for photoexcitation of the singlet excitons, for photons with energies above 3 eV. Note that the peak efficiencies are no more than $1.2 \times 10^{-4}$ electrons per absorbed photon. FIG. 4 shows similar spectra, but now measured for a device formed with a 10:1 blend of Pt-poly-yne to $C_{60}$. Note that the spectral form of the response is similar in shape, indicating that the principal response is due initially to excitation of singlet states in the Pt-poly-yne. Note also that the peak efficiency is now more than a factor of 100 greater than for the device formed with the polymer alone, reaching a value of 1.6%, and exceeding the efficiencies measured for devices of this type made with single layers of other polymers such as PPV when sandwiched between this combination of electrode metals.

FIG. 5 shows the photoluminescence spectra measured with photoexcitation with the UV lines of an argon ion laser (near 360 nm), of both the Pt-poly-yne by itself, and of a blend formed with $C_{60}$ in the ratio Pt-poly-yne:$C_{60}$=15:1. This blend was annealled for 10 hours at 160° C. in vauuo. For the pure polymer, strong luminescence bands are seen peaking at 3.2 eV and at 2.5 eV, which are due to radiative decay of singlet and triplet excitons respectively. In the blend formed with $C_{60}$ both luminescence bands are strongly quenched, with the triplet band being more completely quenched. We attribute this quenching to the charge transfer process from Pt-poly-yne to $C_{60}$. FIG. 6 shows similar data, comparing again the pure polymer with a similar blend which had not been annealled. For this sample, the singlet emission shows little quenching, but the triplet emission is strongly quenched. It seems that the annealing process increases the ability of the $C_{60}$ to accept electrons from the Pt-poly-yne. FIG. 7 compares the luminescence data for the sample before and after annealing, with the data for the annealled sample scaled by a factor of 16. This shows again very clearly that the triplet emission is quenched much more effectively than the singlet emission. This is consistent with the larger diffusion range expected for the longer lived triplet excitons.

Figure 8:
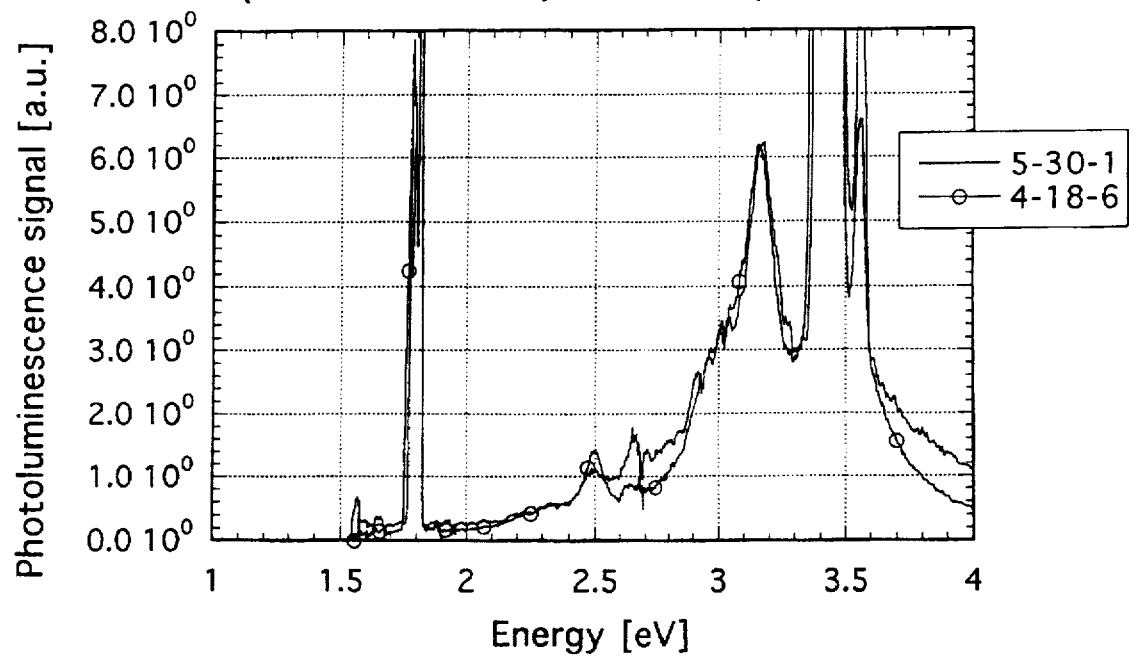
FIG. 8 shows the effect of increasing the $C_{60}$ proportion of the blend. The samples are not annealled but they were kept under inert nitrogen or vacuum after spin-coating. Proportions of Pt-Poly-yne and $C_{60}$ are as indicated in the figure.

FIG. 8 shows photoluminescence data on blends formed with a range of compositions. The samples were not annealled, but were kept under nitrogen or vacuum after spin-coating. The spectra for composition ratios of Pt-poly-yne:$C_{60}$ of 1:1 and 15:1 are very similar, though there is some evidence that the triplet emission is weaker in the 1:1 composition.

Figure 9:
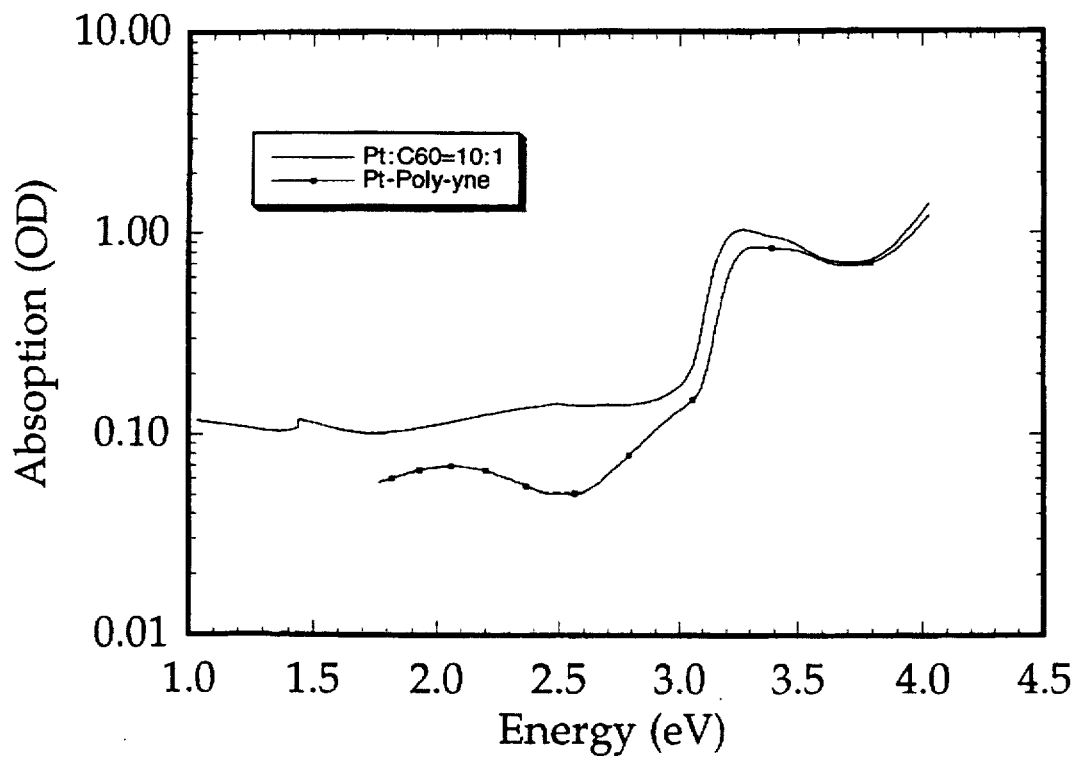
FIG. 9 shows the optical absorption spectra for films of the Pt-poly-yne and also the blend (PtC:$_{60}$=10:1).

FIG. 9 displays the optical absorbance defined as—logarithm(optical transmission) versus photo energy for the Pt-poly-yne and for a blend of Pt-poly-yne:$C_{60}$=10:1. This shows evidence for weak absorption due to the $C_{60}$ in the energy range below the onset of strong absorption in the Pt-poly-yne at 3.0 eV.

The results presented in the series of FIGS. 3–9 provide clear evidence that the mixtures of the Pt-poly-yne with $C_{60}$ show quenching of the triplet luminescence and enhancement of carrier photogeneration, by a factor in excess of 100, over devices made with the Pt-poly-yne alone.

It will be appreciated that the device illustrated in FIG. 1 can be used as a photoconductive or photovoltaic device by suitably selecting the electrical circuitry in block 12 in a manner known to a person skilled in the art. Suitable applications include photodetectors including array detectors and photovoltaic cells.

It will also be readily appreciated that the method described for manufacturing the photoresponsive device makes us of the film-forming properties of these polymers, by spin-coating from solution, for example.

There has been described a photoresponsive material in which photogeneration of separated charge carriers proceeds substantially via an intermediate stage of a triplet exciton, the photoresponsive material containing molecular or polymeric semiconductors. The interconversion of singlet and triplet excited states is facilitated by the presence of an element of high atomic number. Ionisation of the triplet excited state is facilitated by a component of high electron affinity and a component of low ionisation potential, the difference between the ionisation potential of the latter and the electron affinity of the former being lower than the energy of the triplet exciton. The high atomic number element is closely coupled to the conduction or valence electrons of one of the semiconductive components, and may be chosen from the transition metals able to form square-planar coordinated complexes in which at least one of the ligands is an acetylenic group. The photoresponsive material can comprise the combination of fullerene with a transition metal square-planar coordinated complex. There has also been described a device in which the photoresponsive material is arranged between two electrodes which can be used to apply an external bias voltage and which can be used to collect current in an external circuit. One of the electrodes is formed by a transparent conductive layer, e.g. of indium oxide or indium/tin oxide, or a conductive polymer such as polyaniline, polypyrrole or polythiophene, or derivatives of the same (all oxidatively doped to a conductive state). The other conductive electrode can be formed by a metallic layer including aluminium, magnesium, calcium, lithium and related metals, any of which may be alloyed with other metals including silver. The invention also contemplates a method of manufacture of the photoresponsive material in which the several components are co-soluble in a common solvent, such as toluene, chloroform or related organic or organo-halogen solvents. The semiconductive layer can be processed from solution directly onto one of the conductive layers which is itself formed on a substrate layer, e.g. a transparent glass. The substrate could be a flexible material such as thin film of a polymer such as poly(ethylene terephthalate).

What is claimed is:

1. A photoresponsive material comprising:
    an organometallic complex comprising a transition metal; and
    a fullerene, a conjugated polymer with an electron withdrawing group in the main chain, a conjugated polymer with an electron withdrawing group attached as a side chain, a polymer comprising an electron withdrawing oxazole group, a polymer comprising an electron withdrawing oxadiazole group, a molecule comprising an electron withdrawing oxazole group, or a molecule comprising an electron withdrawing oxadiazole group.

2. A photoresponsive material according to claim 1, wherein the organometallic complex comprising a transition metal is a semiconductor.

3. A photoresponsive material according to claim 2, wherein the semiconductor is Pt-poly-yne.

4. A photoresponsive material according to claim 2, wherein the fullerene is $C_{60}/C_{70}$.

5. A photoresponsive material according to claim 2, wherein the conjugated polymer with an electron withdrawing group in the main chain is poly(pyridine), poly(pyrazine), poly(pyridine vinylene), or poly(pyrazine vinylene).

6. A photoresponsive material according to claim 2, wherein the conjugated polymer with an electron withdrawing group attached as a side chain is poly (p-phenylene vinylene) with nitrile groups attached to the main chain.

7. A photoresponsive material according to claim 1, wherein the fullerene is fullerene $C_{60}$.

8. A photoresponsive material according to claim 1, wherein the organometallic complex comprising a transition metal comprises a square planar coordinated complex with four ligands, at least one of which is an acetylenic ligand.

9. A photoresponsive material according to claim 8, wherein the transition metal is platinum.

10. A photoresponsive device comprising:
    a first electrode, a second electrode; and
    arranged between the first electrode and the second electrode a photoresponsive material comprising:
        an organometallic complex comprising a transition metal; and
        a fullerene, a conjugated polymer with an electron withdrawing group in the main chain, a conjugated polymer with an electron withdrawing group attached as a side chain, a polymer comprising an electron withdrawing oxazole group, a polymer comprising an electron withdrawing oxadiazole group, a molecule comprising an electron withdrawing oxazole group, or a molecule comprising an electron withdrawing oxadizole group.

11. A device according to claim 10, wherein the first electrode comprises a transparent conductive layer.

12. A device according to claim 11, wherein the transparent conductive layer is comprises indium oxide; indium/tin oxide; or a conductive polymer comprising a polyaniline, a polypyrrole, or a polythiophene.

13. A device according to claim 10, wherein the second electrode comprises a metallic layer.

14. A device according to claim 13, wherein the metallic layer comprises aluminum, magnesium, calcium, lithium, or an alloy of one of these metals with silver.

* * * * *

UNITED STATES PATENT AND TRADEMARK OFFICE
CERTIFICATE OF CORRECTION

PATENT NO. : 5,698,048

DATED : DECEMBER 16, 1997

INVENTOR(S) : FRIEND ET AL.

It is certified that error appears in the above-identified patent and that said Letters Patent is hereby corrected as shown below:

Col. 3, line 2: "electon" should read —electron—

Signed and Sealed this

Third Day of August, 1999

Attest:

Attesting Officer

Q. TODD DICKINSON

Acting Commissioner of Patents and Trademarks